(12) United States Patent
Chen et al.

(10) Patent No.: US 11,640,963 B2
(45) Date of Patent: May 2, 2023

(54) DISPLAY PANEL AND DISPLAY DEVICE (71) Applicant: WUHAN CHINA STAR OPTOELECTRONICS SEMICONDUCTOR DISPLAY TECHNOLOGY CO., LTD., Hubei (CN)

(72) Inventors: Youshan Chen, Hubei (CN); Feng Zhang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 222 days.

(21) Appl. No.: 16/966,136

(22) PCT Filed: Jun. 19, 2020

(86) PCT No.: PCT/CN2020/097194
§ 371 (c)(1),
(2) Date: Jul. 30, 2020

(87) PCT Pub. No.: WO2021/232527
PCT Pub. Date: Nov. 25, 2021

(65) Prior Publication Data
US 2021/0366950 A1 Nov. 25, 2021

(30) Foreign Application Priority Data

May 19, 2020 (CN) .......................... 202010423552.9

(51) Int. Cl.
*H01L 27/12* (2006.01)
*G02F 1/1362* (2006.01)
*H01L 27/32* (2006.01)

(52) U.S. Cl.
CPC ...... *H01L 27/1244* (2013.01); *H01L 27/1248* (2013.01); *G02F 1/13629* (2021.01); *H01L 27/3276* (2013.01)

(58) Field of Classification Search
CPC ........ H01L 27/1214–1296; H01L 27/32–3293
See application file for complete search history.

(56) References Cited

U.S. PATENT DOCUMENTS 7,629,617 B2    12/2009  Yamazaki et al.
10,475,874 B2 * 11/2019  Rhe ..................... H01L 51/0097
(Continued)

FOREIGN PATENT DOCUMENTS

CN    107342375 A     11/2017
CN    109148532 A  *   1/2019    ......... H01L 27/3244
(Continued)

Primary Examiner — Bryan R Junge
(74) Attorney, Agent, or Firm — Mark M. Friedman (57) ABSTRACT The present application provides a display panel and a display device. The display panel comprises: a base substrate; an insulating layer arranged on the base substrate, the insulating layer being provided with recesses spaced from each other; metal lines arranged on one side of the insulating layer away from the base substrate, portions of the metal lines corresponding to the recesses being located in the recesses, the metal lines having a corrugated longitudinal cross-section in an extending direction of the metal lines to reduce a risk of the metal lines breaking during bending and improve flexibility of the display panel.

14 Claims, 8 Drawing Sheets

(56) References Cited

U.S. PATENT DOCUMENTS

| | | | |
|---|---|---|---|
| 2004/0173836 A1 | 9/2004 | Oh et al. | |
| 2014/0055702 A1* | 2/2014 | Park | H01L 27/3279 257/40 |
| 2016/0218305 A1* | 7/2016 | Kim | H01L 51/0097 |
| 2017/0110526 A1* | 4/2017 | Eo | H01L 27/3262 |
| 2017/0194354 A1* | 7/2017 | Kim | H01L 27/1218 |
| 2019/0058140 A1 | 2/2019 | Shi | |
| 2019/0305010 A1* | 10/2019 | Kim | H01L 27/1214 |
| 2019/0355761 A1* | 11/2019 | Chang | H01L 51/0097 |
| 2019/0363153 A1* | 11/2019 | Matsui | H01L 27/3258 |
| 2019/0363267 A1 | 11/2019 | Tanaka et al. | |
| 2020/0067000 A1* | 2/2020 | Li | H05K 1/0281 |
| 2020/0341516 A1* | 10/2020 | Huang | G06F 1/1637 |

FOREIGN PATENT DOCUMENTS

| | | |
|---|---|---|
| CN | 109148532 A | 1/2019 |
| CN | 109545801 A | 3/2019 |
| CN | 109755287 A | 5/2019 |
| CN | 110444578 A | 11/2019 |
| CN | 110957331 A | 4/2020 |
| KR | 20040079523 A | 9/2004 |

\* cited by examiner

DISPLAY PANEL AND DISPLAY DEVICE

FIELD OF DISCLOSURE

The present application relates to a field of display technology and in particular, to a display panel and a display device.

DESCRIPTION OF RELATED ART

Flexible display devices have obtained wide attention because of being flexible and foldable. However, conventional traces have poor flexibility and cannot meet design requirements.

SUMMARY

The present application provides a display panel and a display device, which can lower a risk of metal lines/traces breaking when they are bent, and improve flexibility of the metal lines/traces.

The present application provides a display panel, comprising:

a base substrate;

an insulating layer disposed on the base substrate, wherein the insulating layer is provided with a plurality of recesses spaced apart from each other; and a plurality of metal lines disposed on one side of the insulating layer away from the base substrate, wherein portions of the metal lines corresponding to the recesses are disposed in the recesses, and the metal lines have a corrugated longitudinal cross-section in an extending direction of the metal lines.

In the display panel, the metal lines comprise a plurality of second metal traces;

the insulating layer comprises a second insulation layer disposed at one side of the second metal traces adjacent to the base substrate;

the recesses comprise a plurality of second grooves arranged spaced apart from each other in the second insulation layer; and portions of the second metal traces are disposed in the second grooves, and the second metal traces have a corrugated longitudinal cross-section in an extending direction of the second metal traces.

In the display panel, the display panel further comprises a filling layer disposed at one side of the second metal traces away from the base substrate, the filling layer is partially located inside the second grooves corresponding to the second metal traces, and a bending strength of the filling layer is less than a bending strength of the second insulation layer.

In the display panel, the second metal traces comprise a plurality of source/drain traces partially disposed in the second grooves, and the source/drain traces have a corrugated longitudinal cross-section in an extending direction of the source/drain traces.

In the display panel, the source/drain traces comprise a plurality of data signal traces and a plurality of common voltage terminal traces.

In the display panel, the metal lines further comprise a plurality of first metal traces disposed on one side of the second insulation layer adjacent to the base substrate;

the insulating layer further comprises a first insulation layer at one side of the first metal traces adjacent to the base substrate;

the recesses further comprise a plurality of first grooves arranged spaced apart from each other in the first insulation layer; and the first metal traces are partially disposed in the first grooves, and the first metal traces have a corrugated longitudinal cross-section in an extending direction of the first metal traces.

In the display panel, from a top view, the first grooves and the second grooves do not coincide with each other.

In the display panel, the first metal traces comprise a plurality of first sub-metal traces disposed on one side of the second insulation layer adjacent to the base substrate and a plurality of second sub-metal traces disposed at one side of the first sub-metal traces adjacent to the base substrate;

the first insulation layer comprises a first sub-insulation layer disposed between the first sub-metal traces and the second sub-metal traces and a second sub-insulation layer disposed at one side of the second sub-metal traces adjacent to the base substrate;

the first grooves comprise a plurality of first sub-grooves spaced apart from each other in the first sub-insulation layer and a plurality of second sub-grooves spaced apart from each other in the second sub-insulation layer;

the first sub-metal traces comprise a plurality of reset signal traces partially disposed in the first sub-grooves, and the reset signal traces have a corrugated longitudinal cross-section in an extending direction of the reset signal traces; and the second sub-metal traces comprise a plurality of gate traces partially disposed in the second sub-grooves, and the gate traces have a corrugated longitudinal cross-section in an extending direction of the gate traces.

In the display panel, the display panel further comprises:

an active layer disposed on one side of the base substrate adjacent to the first metal traces;

an upper capacitor substrate layer disposed in a same layer as the first sub-metal traces and arranged corresponding to the active layer; and a gate disposed in a same layer as the second sub-metal traces and arranged corresponding to the active layer.

In the display panel, the first metal traces comprise a plurality of gate traces partially disposed in the first grooves, and the gate traces have a corrugated longitudinal cross-section in an extending direction of the gate traces.

In the display panel, the gate traces comprise a plurality of scan signal traces and a plurality of light-emitting signal traces.

In the display panel, the display panel further comprises:

an active layer disposed on one side of the base substrate adjacent to the first metal traces;

a gate disposed in a same layer as the first metal traces and arranged corresponding to the active layer; and a source/drain disposed in a same layer as the second metal traces and electrically connected to the active layer.

In the display panel, the display panel further comprises:

an active layer disposed between the second metal traces and the second insulation layer;

a source/drain disposed in a same layer as the second metal traces and directly electrically connected to the active layer; and a gate disposed in a same layer as the first metal traces and arranged corresponding to the active layer.

In the display panel, the display panel further comprises:

an active layer disposed between the first metal traces and the second insulation layer;

a gate disposed in a same layer as the second metal traces and arranged corresponding to the active layer; and a source/drain disposed in a same layer as the first metal traces and directly electrically connected to the active layer.

In the display panel, material of the filling layer comprises an organic material.

In the display panel, the display panel further comprises a pixel definition layer and a light-emitting device disposed on one side of the filling layer away from the base substrate.

In the display panel, the display panel further comprises an electrode layer on one side of the filling layer away from the base substrate.

The present application further provides a display device, wherein the display device comprises a display panel, and the display panel comprises:

a base substrate;

an insulating layer disposed on the base substrate, wherein the insulating layer is provided with a plurality of recesses spaced apart from each other; and a plurality of metal lines disposed on one side of the insulating layer away from the base substrate, wherein portions of the metal lines corresponding to the recesses are disposed in the recesses, and the metal lines have a corrugated longitudinal cross-section in an extending direction of the metal lines.

In the display device, the metal lines comprise a plurality of second metal traces;

the insulating layer comprises a second insulation layer disposed at one side of the second metal traces adjacent to the base substrate;

the recesses comprise a plurality of second grooves arranged spaced apart from each other in the second insulation layer; and portions of the second metal traces are disposed in the second grooves, and the second metal traces have a corrugated longitudinal cross-section in an extending direction of the second metal traces.

In the display device, the metal lines further comprise a plurality of first metal traces disposed on one side of the second insulation layer adjacent to the base substrate;

the insulating layer further comprises a first insulation layer at one side of the first metal traces adjacent to the base substrate;

the recesses further comprise a plurality of first grooves arranged spaced apart from each other in the first insulation layer; and the first metal traces are partially disposed in the first grooves, and the first metal traces have a corrugated longitudinal cross-section in an extending direction of the first metal traces.

Advantages of the Present Application:

Compared to conventional techniques, the display panel and the display device of the present application have the following advantages.

The display panel comprises: a base substrate; an insulating layer disposed on the base substrate, wherein the insulating layer is provided with a plurality of recesses spaced from each other; a plurality of metal lines disposed on one side of the insulating layer away from the base substrate, wherein portions of the metal lines corresponding to the recesses are disposed in the recesses, and the metal lines have a corrugated longitudinal cross-section in an extending direction of the metal lines, so that a risk of the metal lines breaking during bending is lowered, and flexibility of the metal lines is improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

In order to make the purpose, technical solutions and effects of the present application clearer, the present application will be described in detail below with reference to the accompanying drawings and specific embodiments. It should be understood that the embodiments described herein are only used to explain the present application, and are not intended to limit the present application.

Please refer to FIGS. 1A to 1G, which are schematic structural views illustrating a display panel according to one embodiment of the present application. FIG. 2A is a top view illustrating the display panel shown in FIG. 1C. FIG. 2B is a top view illustrating the display panel shown in FIG. 1E. The display panel comprises:

a base substrate 101;

an insulating layer 102 disposed on the base substrate 101, wherein the insulating layer 102 is provided with a plurality of recesses 102a spaced apart from each other;

a plurality of metal lines 103 disposed on one side of the insulating layer 102 away from the base substrate 101, wherein portions of the metal lines 103 corresponding to the recesses 102a are disposed in the recesses 102a, and the metal lines 103 have a corrugated longitudinal cross-section in an extending direction of the metal lines 103. Accordingly, a risk of the metal lines 103 breaking during bending is reduced, and flexibility of the display panel is improved.

Referring to FIGS. 1A to 1G, the metal lines 103 comprise a plurality of second metal traces 1032;

the insulating layer 102 comprises a second insulation layer 1022 disposed at one side of the second metal traces 1032 adjacent to the base substrate 101;

the recesses 102a comprise a plurality of second grooves 1022a arranged spaced apart from each other in the second insulation layer 1022; and portions of the second metal traces 1032 are disposed in the second grooves 1022a, and the second metal traces 1032 have a corrugated longitudinal cross-section in an extending direction of the second metal traces 1032, so that the flexibility of the display panel is improved.

Figure 1A:
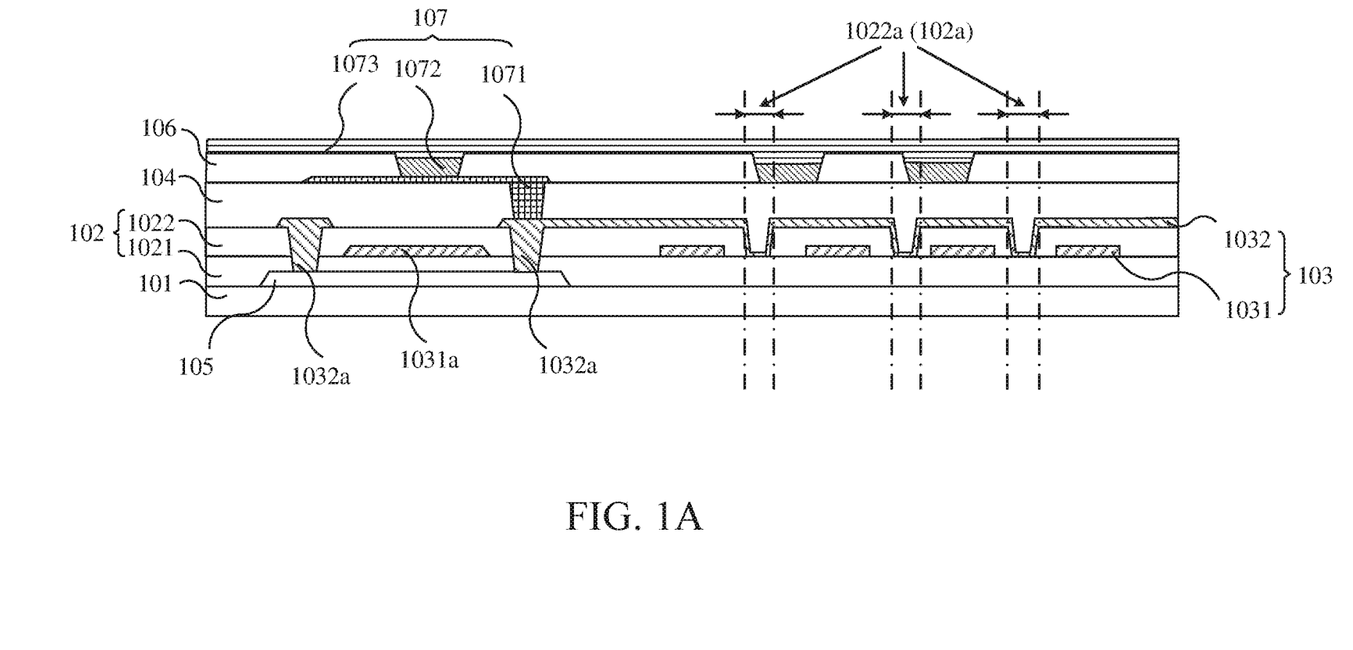
FIGS. 1A to 1G are schematic structural views illustrating a display panel according to one embodiment of the present application.
Figure 1B:
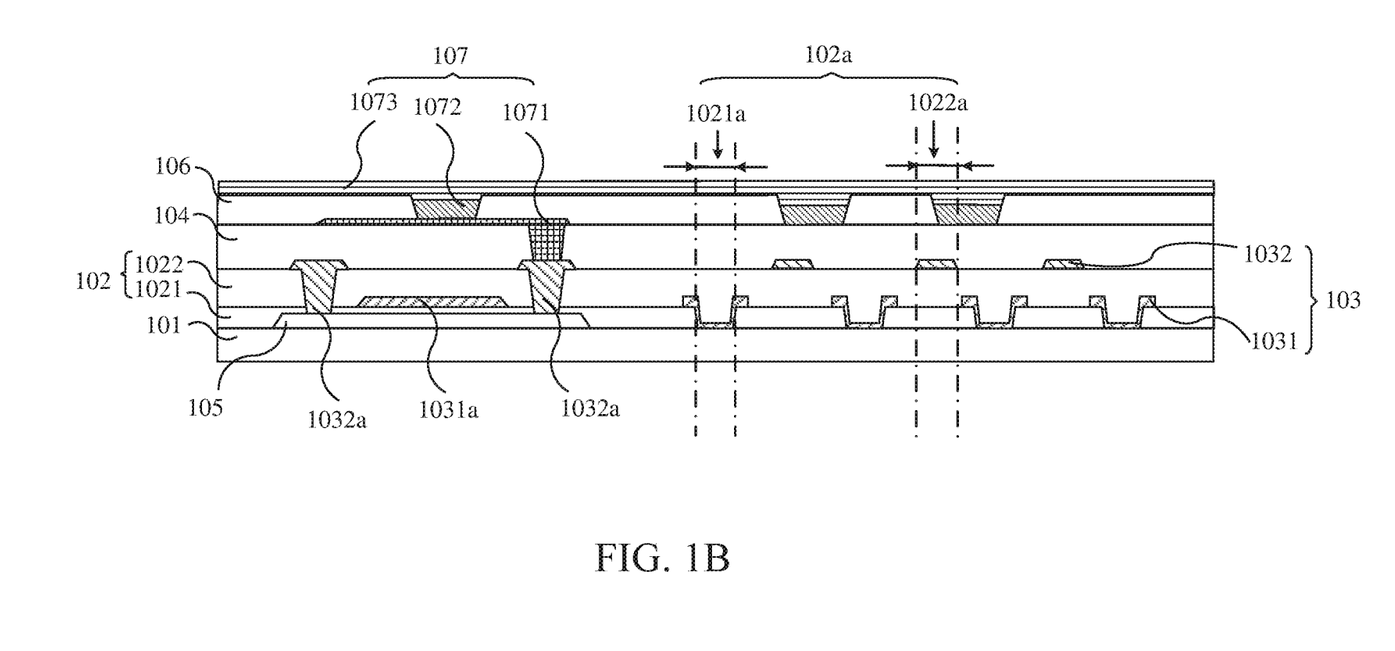
Figure 1C:
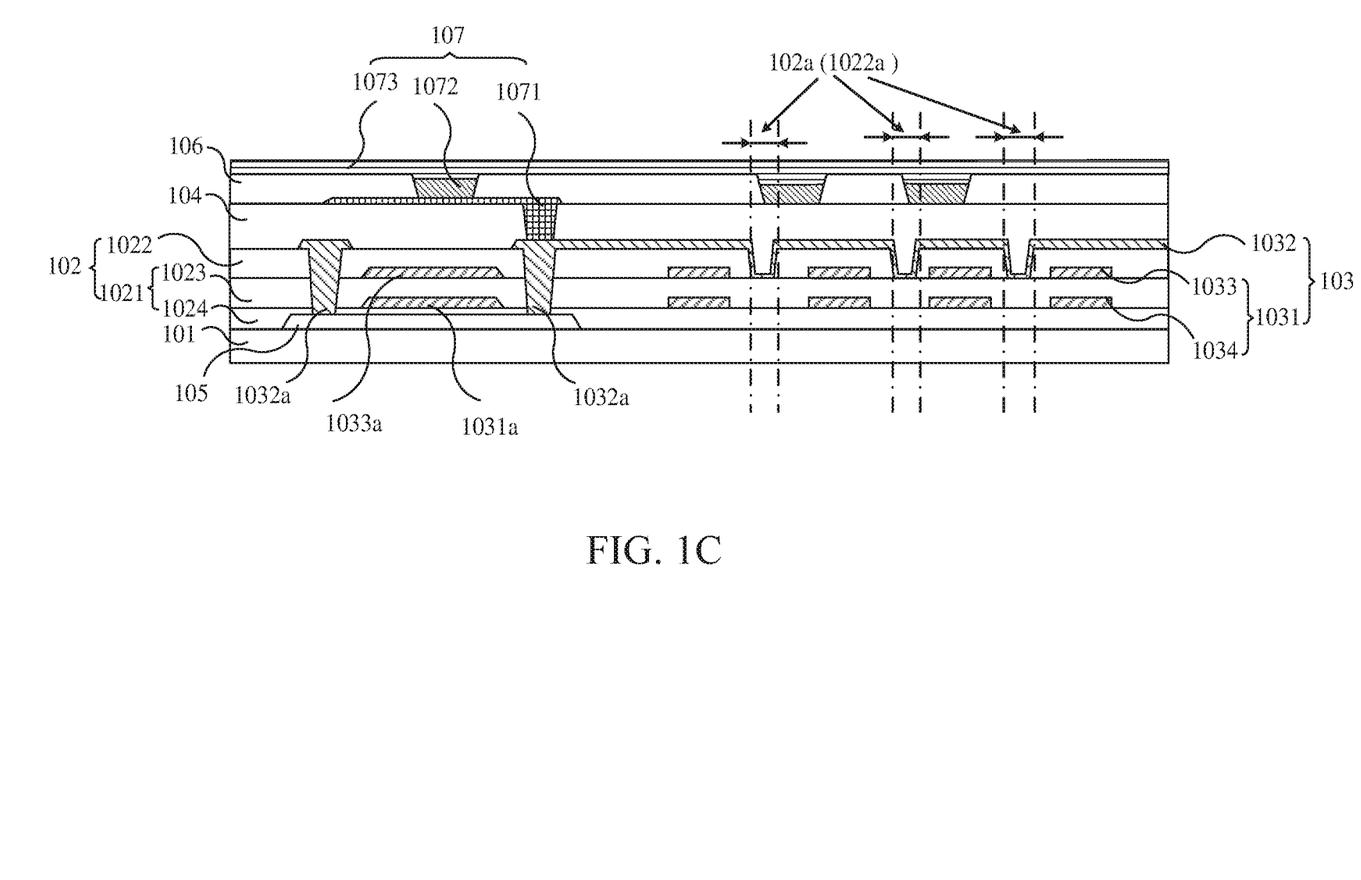
Figure 1D:
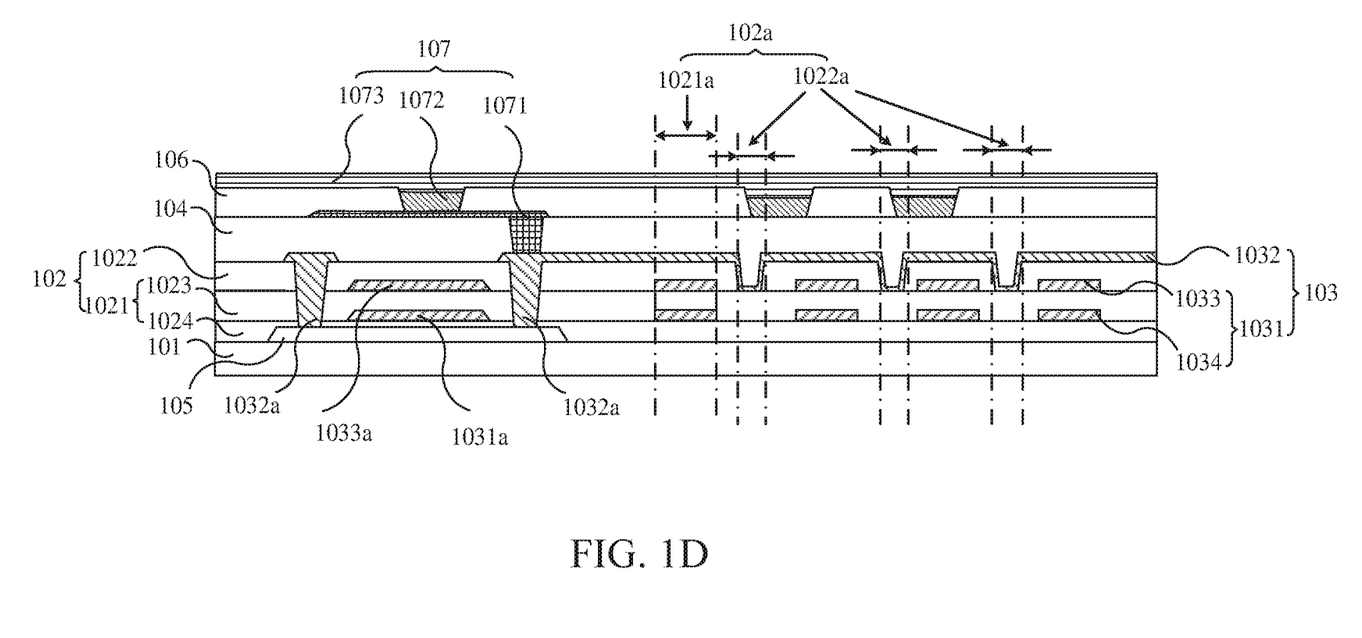

Referring to FIGS. 1A to 1E. The second metal traces 1032 comprise a plurality of source/drain traces partially disposed in the second grooves 1022a. The source/drain traces have a corrugated longitudinal cross-section in an extending direction of the source/drain traces, as shown in FIG. 1A and FIGS. 1C to 1D (The source/drain trace in FIGS. 1C and 1E correspond to SD in FIGS. 2A and 2B).

The source/drain traces comprise a plurality of data signal traces Vdata and a plurality of common voltage terminal traces. Specifically, the common voltage terminal trace is a constant voltage high-level signal trace Vdd.

Figure 1E:
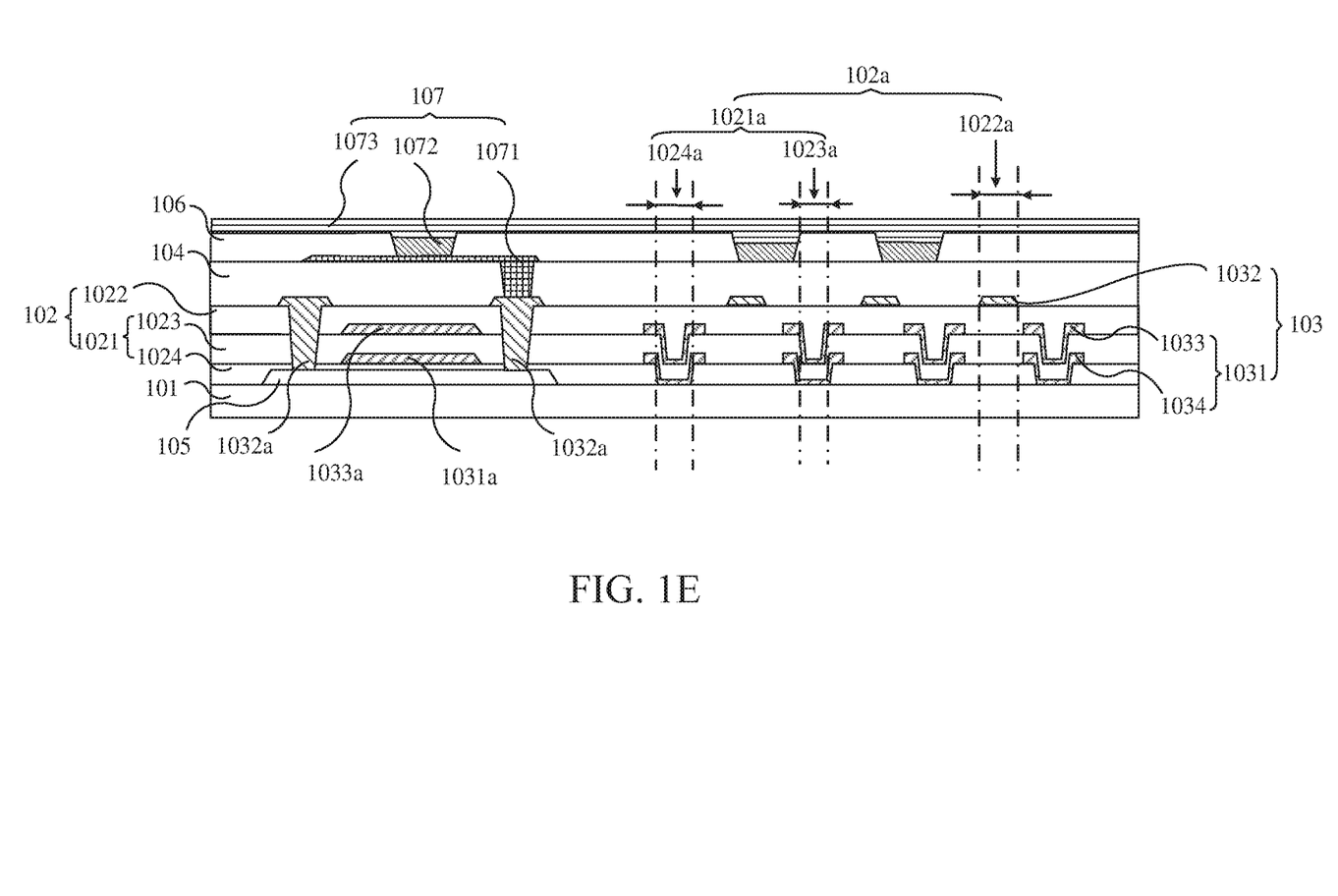
Figure 2A:
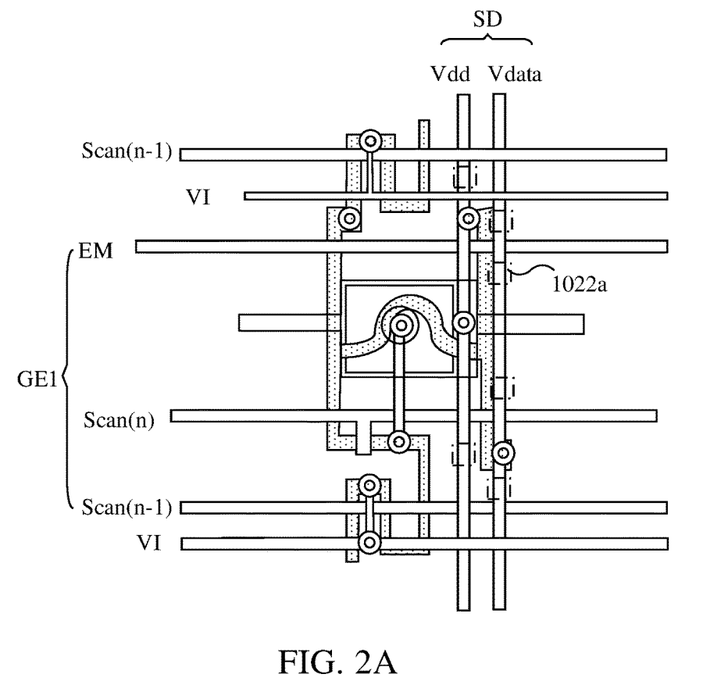
FIG. 2A is a top view illustrating the display panel shown in FIG. 1C.
Figure 2B:
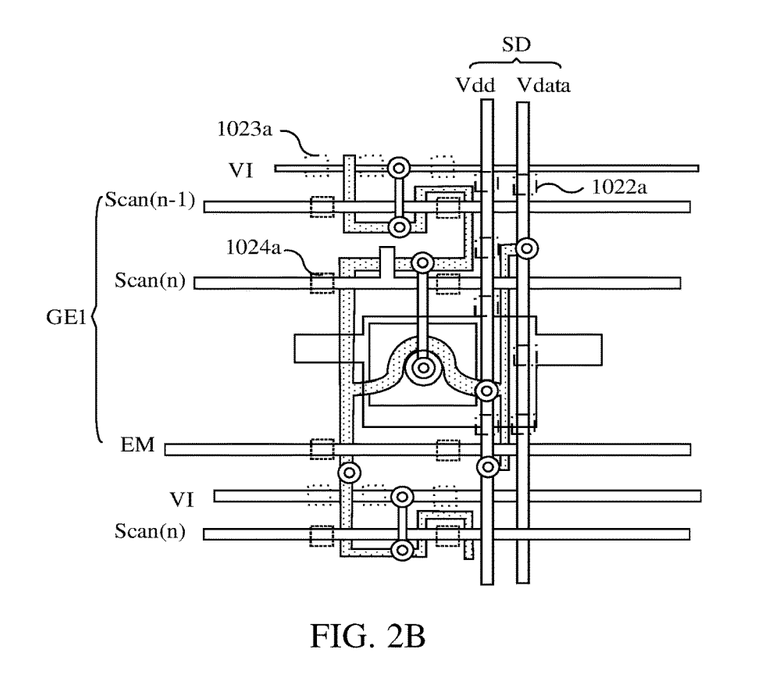
FIG. 2B is a top view of the display panel shown in FIG. 1E.

The metal lines 103 further comprise a plurality of first metal traces 1031 disposed on one side of the second insulation layer 1022 adjacent to the base substrate 101;

the insulating layer 102 further comprises a first insulation layer 1021 at one side of the first metal traces 1031 adjacent to the base substrate 101;

the recesses 102a further comprise a plurality of first grooves 1021a arranged spaced apart from each other in the first insulation layer 1021, as shown in FIG. 1B and FIGS. 1D to 1E; and the first metal traces 1031 are partially disposed in the first grooves 1021a, and the first metal traces 1031 have a corrugated longitudinal cross-section in an extending direction of the first metal traces 1031 so as to improve the flexibility of the display panel, as shown in FIGS. 1B and 1E.

In FIG. 1B, the first metal traces 1031 comprise a plurality of gate traces partially disposed in the first grooves 1021a, and the gate traces have a corrugated longitudinal cross-section in an extending direction of the gate traces 1031.

Referring to FIGS. 1C to 1E, the first metal traces 1031 comprise a plurality of first sub-metal traces 1033 disposed on one side of the second insulation layer 1022 adjacent to the base substrate 101 and a plurality of second sub-metal traces 1033 disposed at one side of the first sub-metal traces 1033 adjacent to the base substrate 101;

the first insulation layer 1021 comprises a first sub-insulation layer 1023 disposed between the first sub-metal traces 1033 and the second sub-metal traces 1034 and a second sub-insulation layer 1024 at one side of the second sub-metal traces 1034 adjacent to the base substrate 1011;

the first grooves 1021a comprise a plurality of first sub-grooves 1023a spaced apart from each other in the first sub-insulation layer 1023 and a plurality of second sub-grooves 1024a spaced apart from each other in the second sub-insulation layer 1024;

the first sub-metal traces 1033 comprise a plurality of reset signal traces partially disposed in the first sub-grooves 1023a (the reset signal traces in FIGS. 1C and 1E correspond to VI in FIGS. 2A to 2B), and the reset signal traces have a corrugated longitudinal cross-section in an extending direction of the reset signal traces; and the second sub-metal traces 1034 comprise a plurality of gate traces partially disposed in the second sub-grooves 1024a (the gate traces in FIGS. 1C and 1E correspond to GE1 in FIGS. 2A and 2B), and the gate traces have a corrugated longitudinal cross-section in an extending direction of the gate traces.

The first metal traces 1031 comprise scan signal traces Scan(n) and Scan(n−1), and a light-emitting signal trace EM. Furthermore, the first metal traces 1031 further comprises a reset signal trace VI. To be specific, the gate traces comprise the scan signal traces Scan(n) and Scan(n−1), and the light-emitting signal traces EM.

To avoid short-circuiting between the first metal traces 1031 and the second metal traces 1032, the first grooves 1021a and the second grooves 1022a do not coincide with each other from a top view. In other words, from a top view, the first grooves 1021a and the second grooves 1022a are located in areas where the first metal traces 1031 and the second metal traces 1032 do not intersect, as shown in FIG. 2A and FIG. 2B.

It should be noted that if the display panel is only provided with the first grooves 1021a or the second grooves 1022a, the first grooves 1021a or the second grooves 1022a are still disposed in the areas where the first metal traces 1031 and the second metal traces 1032 do not intersect in order to avoid short-circuiting between the second metal traces 1032 and the first metal traces 1031.

The first sub-grooves 1023a can be obtained by performing a photolithography process added in a manufacturing process after the first sub-insulation layer 1023 is formed. Similarly, the second sub-groove 1024a can be formed by performing a photolithography process added in the manufacturing process after the second sub-insulation layer 1024 is formed.

Please refer to FIGS. 1A to 1G. In order to avoid damage to the second metal traces 1032 and further improve flexibility of the display panel, the display panel further comprises a filling layer 104 arranged at one side of the second metal traces 1032 away from the base substrate 101, the filling layer 104 is partially located in a plurality of recessed portions of the second metal trace 1032 corresponding to the plurality of second grooves 1022a. Bending strength of the filling layer 104 is lower than that of the second insulation layer 1022.

Furthermore, material of the filling layer 104 comprises an organic material.

In addition, the filling layer 104 can also planarize surfaces of the second metal traces 1032, as shown in FIGS. 1A to 1E, to improve uniformity of the display panel and ensure precision in light propagation in the display panel.

Please refer to FIGS. 1A to 1E. The display panel further comprises: an active layer 105 disposed on one side of the base substrate 101 adjacent to the first metal traces 1031; a gate 1031a disposed in the same layer as the first metal traces 1031 and arranged corresponding to the active layer 105; and a source/drain 1032a in the same layer as the second metal traces 1032 and electrically connected to the active layer 105.

Furthermore, if the first metal traces 1031 comprise the first sub-metal traces 1033 and the second sub-metal traces 1034, the display panel further comprises an upper capacitor substrate layer 1033a disposed in the same layer as the first sub-metal traces 1033 and arranged corresponding to the active layer 105. The gate 1031a is disposed in the same layer as the second sub-metal trace 1034 and arranged corresponding to the active layer 105.

Furthermore, the display panel further comprises a pixel definition layer 106 and a light-emitting device 107 disposed on one side of the filling layer 104 away from the base substrate 101.

The light-emitting device 107 comprises an anode 1071 electrically connected to one (the source or the drain) of the source/drain 1032a, a light-emitting layer 1072 arranged in a pixel definition body of the pixel definition layer 106, and a cathode 1073 on one side of the pixel definition layer 106 away from the filling layer 104.

In addition, in order to save manufacturing steps, a via hole and the second groove 1022a that electrically connect the source/drain 1032a and the active layer 105 can be produced in a same manufacturing step. That is to say, after the active layer 105, the first metal traces 1031, and the entire second insulation layer 1022 are formed in sequence on a surface of the base substrate 101, a light exposure step is performed on the second insulation layer 1022 through a half-tone mask to form the recesses in the second insulation layer 1022 and form the via hole that can establish electrical connection between the source/drain 1032a and the active layer 105.

Figure 1F:
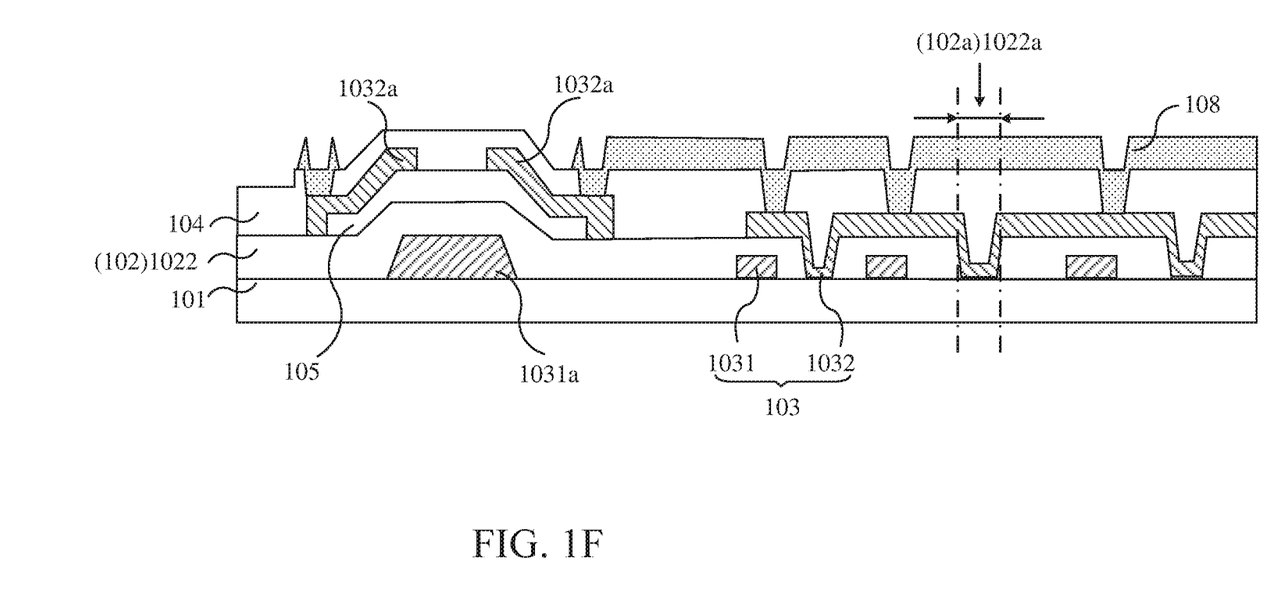

Please refer to FIG. 1F. The active layer 105 is disposed between the second metal traces 1032 and the second insulation layer 1022, and the source/drain 1032a is in the same layer as the second metal traces 1032 and is directly electrically connected to the active layer 105. The gate 1031*a* is in the same layer as the first metal traces 1031 and is disposed corresponding to the active layer 105.

Furthermore, the display panel further comprises an electrode layer 108 disposed on one side of the filling layer 104 away from the base substrate 101, and the electrode layer 108 is electrically connected to one (the source or the drain) of the source/drain 1032*a* through a via hole in the filling layer 104.

Furthermore, the display panel further comprises portions that are not illustrated, such as a first alignment layer, liquid crystal molecules, and a color filter substrate disposed on one side of the electrode layer away from the base substrate 101.

Figure 1G:
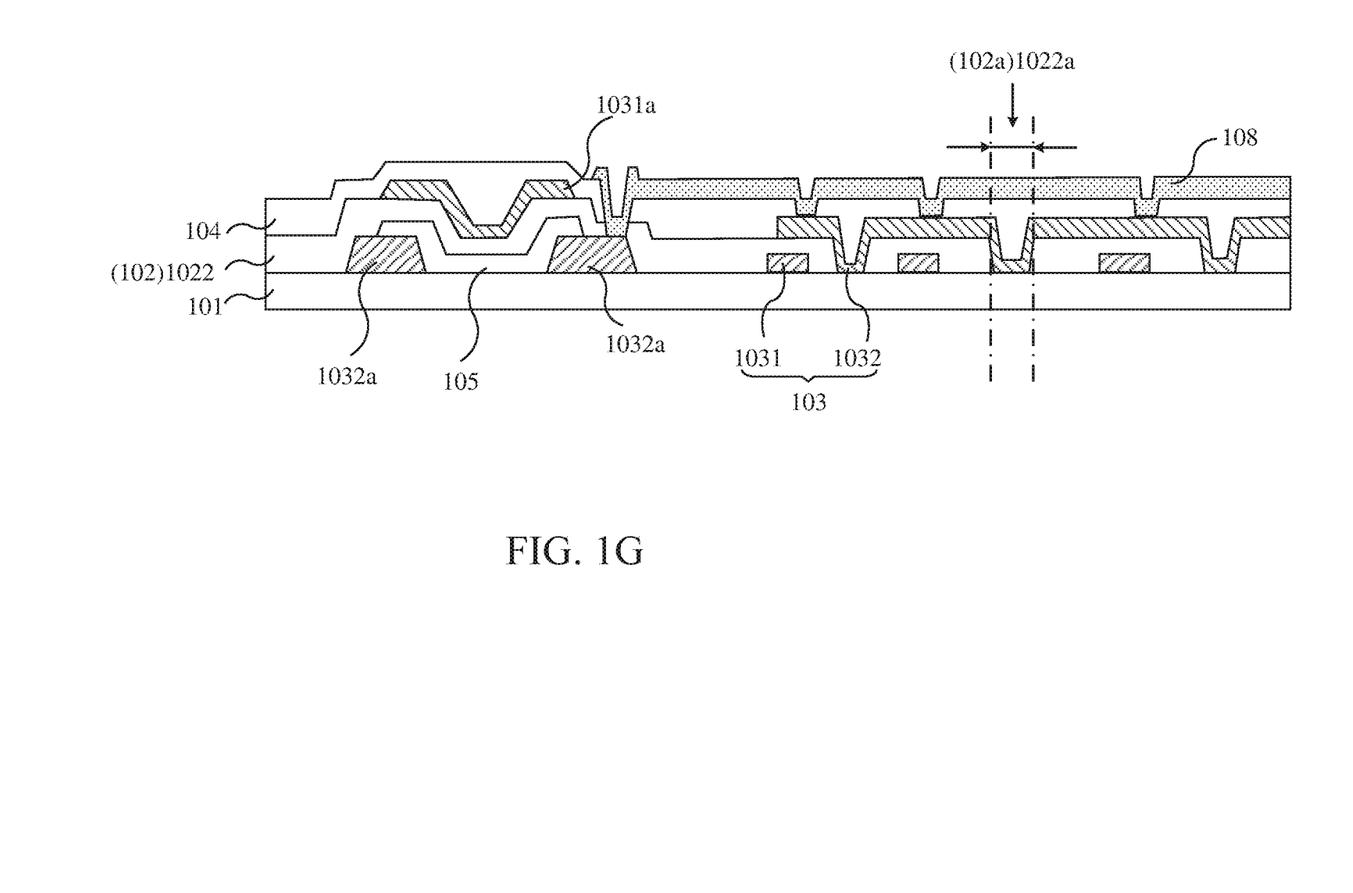

Please refer to FIG. 1G, the second metal traces 1032 comprise a plurality of gate traces partially located in the plurality of second grooves 1022*a*; and the metal lines 103 further comprises a plurality of first metal traces 1031 located on one side of the second insulation layer 1022 adjacent to the base substrate 101.

Furthermore, the display panel further comprises: the active layer 105 disposed between the first metal traces 1031 and the second insulation layer 1022; the gate 1031*a* disposed in the same layer as the second metal traces 1032 and disposed corresponding to the active layer 105; and the source/drain 1032*a* in the same layer as the first metal traces 1031 and directly electrically connected to the active layer 105.

Furthermore, the display panel further comprises the electrode layer 108 disposed on one side of the filling layer 104 away from the base substrate, and the electrode layer 108 is electrically connected to one of the source/drain through the via hole in the filling layer 104.

Furthermore, the display panel further comprises portions that are not illustrated, such as the first alignment layer, the liquid crystal molecules, and the color filter substrate on one side of the electrode layer away from the base substrate 101.

In addition, in the display panel shown in FIGS. 1A to 1G, the display panel may further include portions that are not illustrated, such as a buffer layer disposed between the first metal traces 1031 and the first substrate 101.

FIGS. 2A to 2B only use a 7T1C (T represents a thin film transistor; C represents a capacitor) structure as an example, but the present invention is not limited in this regard. Those skilled in the art may also use 1T1C, 5T2C, and 8T3C structures, and a detailed description is not provided here.

The present application provides a display device which comprises the display panel.

Furthermore, the display device is a display device that can realize dynamic bending or a display device that can maintain static bending. The display device that can maintain static bending maintains a bending angle unchanged after the display panel is bent, that is, a curvature of the display device after bending is not changed. The display device that can realize dynamic bending can realize different bending methods such as folding, curving and multiple bending; and according to actual needs, bending directions, bending positions, and bending angles can be set, so a detailed description thereof is not provided here.

Because the display panel has improved flexibility, when the display panel is used in the display device that can maintain static bending, the display device can reduce the risk of lines breaking during bending, improve the flexibility of the display device, and extend a service life of the display device. When the display panel is used in a display device that can realize dynamic bending, the display device can realize an adjustable viewing-area design and at the same time also improve the flexibility of the display device and extend the service life of the display device.

Further, the display device further comprises a touch panel. The touch panel is integrated with the display panel in a built-in or plug-in manner to realize touch operations of the display device.

Furthermore, the display device further comprises an encapsulation layer to prevent the display panel from being corroded by water and oxygen, and to prolong the service life of the display device.

The present application provides the display panel and the display device. The display panel comprises: the base substrate 101; the insulating layer 102 disposed on the base substrate 101, wherein the insulating layer 102 is provided with the recesses 102*a* spaced from each other; and the metal lines 103 disposed on one side of the insulating layer 102 away from the base substrate 101, wherein portions of the metal lines 103 corresponding to the recesses 102*a* are disposed in the recesses 102*a*, and the metal lines 103 have a corrugated longitudinal cross-section in the extending direction of the metal lines 103 to reduce the risk of the metal traces 103 breaking during and improve the flexibility of the display panel.

In the above embodiments, the description of each embodiment has its own emphasis. For those that are not detailed in one embodiment, related descriptions can be found in other embodiments.

The display panel and the display device of the present application are described in detail above, and the specific embodiments are used to explain the working principles of the present application. The descriptions of the above embodiments are only used for ease of understanding of the technical solution and the core ideas of the present application. Those of ordinary skill in the art should understand that they can modify the technical solutions described in the foregoing embodiments, or equivalently replace some of the technical features. Such modifications or replacements should be deemed to fall within the protection scope of the present application.

What is claimed is:

1. A display panel, comprising:
    a base substrate;
    an insulating layer disposed on the base substrate, wherein the insulating layer comprises a first insulation layer, a second insulation layer disposed on the first insulation layer, and a plurality of recesses spaced apart from each other, wherein the recesses comprise a plurality of first grooves arranged spaced apart from each other in the first insulation layer and a plurality of second grooves arranged spaced apart from each other in the second insulation layer; and
    a plurality of metal lines, wherein the metal lines comprise a plurality of first metal traces disposed in the insulating layer and a plurality of second metal traces disposed on the insulating layer, the first metal traces are disposed on one side of the second insulation layer adjacent to the base substrate, the first insulation layer is disposed at one side of the first metal traces adjacent to the base substrate, portions of the second metal traces are disposed in the second grooves, and the second metal traces have a corrugated longitudinal cross-section in an extending direction of the second metal traces, wherein the first metal traces are partially disposed in the first grooves, and the first metal traces have a corrugated longitudinal cross-section in an extending direction of the first metal traces, wherein the first metal traces comprise a plurality of first sub-metal traces disposed on one side of the second insulation layer adjacent to the base substrate and a plurality of second sub-metal traces disposed at one side of the first sub-metal traces adjacent to the base substrate;

the first insulation layer comprises a first sub-insulation layer disposed between the first sub-metal traces and the second sub-metal traces and a second sub-insulation layer disposed at one side of the second sub-metal traces adjacent to the base substrate;

the first grooves comprise a plurality of first sub-grooves spaced apart from each other in the first sub-insulation layer and a plurality of second sub-grooves spaced apart from each other in the second sub-insulation layer;

the first sub-metal traces comprise a plurality of reset signal traces partially disposed in the first sub-grooves, and the reset signal traces have a corrugated longitudinal cross-section in an extending direction of the reset signal traces; and the second sub-metal traces comprise a plurality of gate traces partially disposed in the second sub-grooves, and the gate traces have a corrugated longitudinal cross-section in an extending direction of the gate traces.

2. The display panel according to claim 1, wherein the display panel further comprises a filling layer disposed at one side of the second metal traces away from the base substrate, the filling layer is partially located inside the second grooves corresponding to the second metal traces, and a bending strength of the filling layer is less than a bending strength of the second insulation layer.

3. The display panel according to claim 1, wherein the second metal traces comprise a plurality of source/drain traces partially disposed in the second grooves, and the source/drain traces have a corrugated longitudinal cross-section in an extending direction of the source/drain traces.

4. The display panel according to claim 3, wherein the source/drain traces comprise a plurality of data signal traces and a plurality of common voltage terminal traces.

5. The display panel according to claim 1, wherein from a top view, the first grooves and the second grooves do not coincide with each other.

6. The display panel according to claim 1, wherein the display panel further comprises:
an active layer disposed on one side of the base substrate adjacent to the first metal traces;
an upper capacitor substrate layer disposed in a same layer as the first sub-metal traces and arranged corresponding to the active layer; and
a gate disposed in a same layer as the second sub-metal traces and arranged corresponding to the active layer.

7. The display panel according to claim 1, wherein the first metal traces comprise a plurality of gate traces partially disposed in the first grooves, and the gate traces have a corrugated longitudinal cross-section in an extending direction of the gate traces.

8. The display panel according to claim 7, wherein the gate traces comprise a plurality of scan signal traces and a plurality of light-emitting signal traces.

9. The display panel according to claim 1, wherein the display panel further comprises:
an active layer disposed on one side of the base substrate adjacent to the first metal traces;
a gate disposed in a same layer as the first metal traces and arranged corresponding to the active layer; and a source/drain disposed in a same layer as the second metal traces and electrically connected to the active layer.

10. The display panel according to claim 2, wherein material of the filling layer comprises an organic material.

11. The display panel according to claim 2, wherein the display panel further comprises a pixel definition layer and a light-emitting device disposed on one side of the filling layer away from the base substrate.

12. The display panel according to claim 2, wherein the display panel further comprises an electrode layer on one side of the filling layer away from the base substrate.

13. A display device, wherein the display device comprises a display panel, and the display panel comprises:
a base substrate;
an insulating layer disposed on the base substrate, wherein the insulating layer comprises a first insulation layer, a second insulation layer disposed on the first insulation layer, and a plurality of recesses spaced apart from each other, wherein the recesses comprise a plurality of first grooves arranged spaced apart from each other in the first insulation layer and a plurality of second grooves arranged spaced apart from each other in the second insulation layer; and
a plurality of metal lines, wherein the metal lines comprise a plurality of first metal traces disposed in the insulating layer and a plurality of second metal traces disposed on the insulating layer, the first metal traces are disposed on one side of the second insulation layer adjacent to the base substrate, the first insulation layer is disposed at one side of the first metal traces adjacent to the base substrate, portions of the second metal traces are disposed in the second grooves, and the second metal traces have a corrugated longitudinal cross-section in an extending direction of the second metal traces, wherein the first metal traces are partially disposed in the first grooves, and the first metal traces have a corrugated longitudinal cross-section in an extending direction of the first metal traces, wherein the first metal traces comprise a plurality of first sub-metal traces disposed on one side of the second insulation layer adjacent to the base substrate and a plurality of second sub-metal traces disposed at one side of the first sub-metal traces adjacent to the base substrate;

the first insulation layer comprises a first sub-insulation layer disposed between the first sub-metal traces and the second sub-metal traces and a second sub-insulation layer disposed at one side of the second sub-metal traces adjacent to the base substrate;

the first grooves comprise a plurality of first sub-grooves spaced apart from each other in the first sub-insulation layer and a plurality of second sub-grooves spaced apart from each other in the second sub-insulation layer;

the first sub-metal traces comprise a plurality of reset signal traces partially disposed in the first sub-grooves, and the reset signal traces have a corrugated longitudinal cross-section in an extending direction of the reset signal traces; and the second sub-metal traces comprise a plurality of gate traces partially disposed in the second sub-grooves, and the gate traces have a corrugated longitudinal cross-section in an extending direction of the gate traces.

14. The display device according to claim 13, wherein the first metal traces are partially disposed in the first grooves, and the first metal traces have a corrugated longitudinal cross-section in an extending direction of the first metal traces.

* * * * *